(12) United States Patent
Petruzzi et al.

(10) Patent No.: US 7,911,260 B2
(45) Date of Patent: Mar. 22, 2011

(54) CURRENT CONTROL CIRCUITS

(75) Inventors: Luca Petruzzi, Goedersdorf (AT); Paolo Del Croce, Villach (AT); Markus Ladurner, Villach (AT); Bernhard Meldt, Villach (AT); Adrian Apostol, Bucharest (RO); Vasile Matei, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 46 days.

(21) Appl. No.: 12/364,304

(22) Filed: Feb. 2, 2009

(65) Prior Publication Data

US 2010/0194462 A1 Aug. 5, 2010

(51) Int. Cl.
*G05F 1/10* (2006.01)
(52) U.S. Cl. ........................................ 327/535; 327/537
(58) Field of Classification Search .................. 327/535, 327/537
See application file for complete search history.

(56) References Cited

U.S. PATENT DOCUMENTS

| | | | |
|---|---|---|---|
| 4,345,265 A | 8/1982 | Blanchard | |
| 4,800,339 A * | 1/1989 | Tanimoto et al. | 330/253 |
| 4,808,853 A * | 2/1989 | Taylor | 326/57 |
| 4,984,204 A | 1/1991 | Sato et al. | |
| 5,034,796 A | 7/1991 | Zommer | |
| 5,072,266 A | 12/1991 | Bulucea et al. | |
| 5,156,989 A | 10/1992 | Williams et al. | |
| 5,541,799 A | 7/1996 | Schmidt et al. | |
| 5,640,034 A | 6/1997 | Malhi | |
| 6,031,265 A | 2/2000 | Hshieh | |
| 6,292,341 B1 | 9/2001 | Milanesi et al. | |
| 6,472,678 B1 | 10/2002 | Hshieh et al. | |
| 6,479,877 B1 | 11/2002 | Koyama et al. | |
| 6,690,062 B2 | 2/2004 | Henninger et al. | |
| 6,724,227 B2 | 4/2004 | Imai | |
| 6,750,507 B2 | 6/2004 | Williams et al. | |
| 7,009,374 B2 * | 3/2006 | Neaves | 323/317 |
| 7,106,042 B1 * | 9/2006 | Jackson | 323/316 |
| 7,183,756 B1 | 2/2007 | Dikken et al. | |
| 7,323,850 B2 * | 1/2008 | Ryu et al. | 323/222 |
| 7,336,122 B2 * | 2/2008 | Ko et al. | 327/538 |
| 7,479,771 B2 * | 1/2009 | Ryu et al. | 323/271 |
| 7,659,706 B2 * | 2/2010 | Nishida | 323/314 |
| 2005/0093617 A1 * | 5/2005 | Min et al. | 327/538 |

OTHER PUBLICATIONS

Del Croce, et al, "Configurable High Side Power Switch in Smart Power Technology", MIXDES 2007, Jun. 21-23, 2007, pp. 570-573, Department of Microelectronics & Computer Science, Technical University of Lodz, Ciechocinek, Poland.
Graf, et al., "Sense Highside Switch in Smart Power Technology takes over Fuse Function", 7. Internationale Fachtagung Elektronik im Kraftfahrzeug, Sep. 12/13, 1996, Baden-Baden pp. 1-20.

* cited by examiner

*Primary Examiner* — Lincoln Donovan
*Assistant Examiner* — Ryan C Jager
(74) *Attorney, Agent, or Firm* — Slater & Matsil, L.L.P.

(57) ABSTRACT

Circuit, system and method of current control circuits are disclosed. In one embodiment, a control circuit includes a first MOS transistor and a second MOS transistor. The first source/drains of the first and the second MOS transistors are coupled to an output of a power source. A second source/drain of the first MOS transistor is coupled to a first output node of the current control circuit. A second source/drain of the second MOS transistor is coupled to a second output node of the current control circuit. The control circuit further includes a means to block flow of current from the first output node of the current control circuit to the second output node of the current control circuit.

31 Claims, 9 Drawing Sheets

CURRENT CONTROL CIRCUITS

TECHNICAL FIELD

The present invention relates generally to control circuits, and more particularly to current control circuits.

BACKGROUND

Switches are widely used in, for example, automotive applications to drive different types of loads, for example, motors, relays, bulbs, LED modules for interior and exterior lighting, etc. A microcontroller monitors the operation of these different types of loads. The microcontroller protects the integrated circuits against overloading and initiates suitable measures in the case of an electrical overload. For this purpose, the current flow through a corresponding circuit, in particular a power semiconductor device, is usually detected and compared with predetermined values. Although the switches are protected internally against electrical over stress, the microcontroller receives the current flow information to apply a further protection strategy.

The micro controller adjusts the operation of various components based on the current flowing through a sensor circuit. Under certain operating conditions, called inverse conditions, large flow of current through the sensor circuitry is possible resulting in erroneous measurements by the micro controller. Such erroneous measurements can result in an incorrect response from the micro controller. During inverse conditions, the current through the sensor circuit is disturbed and, as a consequence, the microcontroller receives incorrect information.

Hence, what are needed are means to minimize measurement errors during adverse operating conditions.

SUMMARY OF THE INVENTION

These and other problems are generally solved or circumvented, and technical advantages are generally achieved, by preferred embodiments of the present invention.

Embodiments of the invention include current control circuits. In accordance with a preferred embodiment of the present invention, a control circuit comprises a first MOS transistor and a second MOS transistor. The first source/drains of the first and the second MOS transistors are coupled to an output of a power source. A second source/drain of the first MOS transistor is coupled to a first output node of the current control circuit. A second source/drain of the second MOS transistor is coupled to a second output node of the current control circuit. The control circuit further comprises a means to block flow of current from the first output node of the current control circuit to the second output node of the current control circuit.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 3, which includes FIGS. 3a-3c, is an illustration of operation of a prior art switch during inverse operation, wherein FIG. 3a illustrates the operation under inverse operation, and FIGS. 3b and 3c illustrate the parasitic components that conduct during inverse operation;

FIG. 4, which includes FIGS. 4a and 4b, is an illustration of operation of a switch with an additional switch to minimize parasitic conduction during inverse operation in accordance with an embodiment of the invention, wherein FIG. 4a illustrates the operation under normal operation, and FIG. 4b illustrates the operation under inverse operation to prevent wrong sensing during inverse operation;

FIG. 6, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely to protection circuitry for current sensing. The invention may also be applied, however, to other functions, for example, preventing current or voltage pulses, and other devices and circuitry.

Switches are widely used in various applications to drive different types of loads, for example, motors, relays, bulbs, or LED modules for interior and exterior lighting. Each switch includes a power switching device that is coupled to the different types of loads. The power switching device comprises, for example, a DMOS transistor. A microcontroller uses a current sensor to monitor the current flow through the switch and hence into each of the different loads.

The current sensor is a smaller transistor than the power switching device, but supplies a current proportional to the load current in the power switching device if the voltage values applied to it are the same as those applied to the power switching device. This smaller transistor, which is also referred to as a sense DMOS transistor, has an area smaller than that of the load DMOS transistor by a factor of 1,000 to 100,000. The sense current flow through the sense DMOS transistor is thus geometrically related to the load DMOS transistor. Hence, a measure of the sense current through the sense DMOS transistor is a measure of the current flowing through the load DMOS transistor.

Under normal operating conditions, a load current and a sense current flow through the load and sense DMOS transistors in a first direction, for example, from the node of the load DMOS transistor coupled to the power source to the node of the load DMOS transistor coupled to the load. However, in some conditions called inverse operation conditions, the flow of current is reversed, resulting in possible breakdown of components of the circuit and resulting in an erroneous measurement of sense current. In various embodiments, the invention avoids the flow of sense current during inverse operating conditions by providing a robust current sensing circuit.

Figure 1:
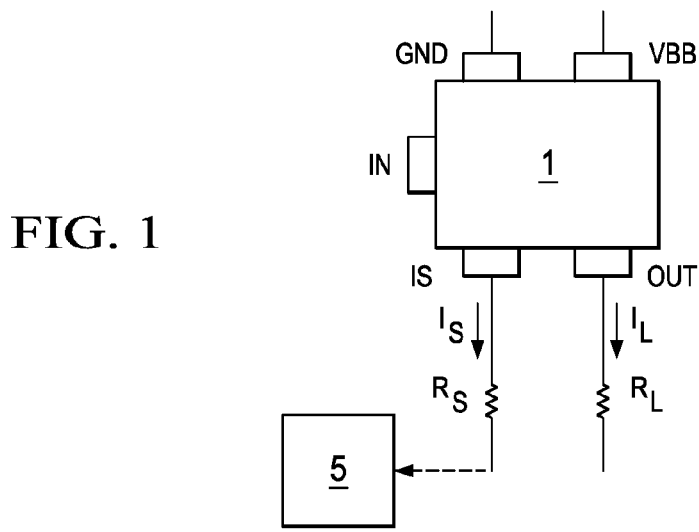
FIG. 1 is an illustration of an operation of a switch in accordance with embodiments of the invention.

FIG. 1 describes an embodiment of the invention and illustrates blocking inverse current flow through a switch. FIGS. 4 and 5 describe embodiments using an auxiliary switch and comparator to block inverse current flow. An embodiment of the invention is described in FIG. 6 using blocking diodes to shut off high leakage current paths.

FIG. 1 illustrates a switch 1 under normal and inverse operating conditions. Under normal operating conditions, the device is turned on by applying a potential on the input pin IN, for example, by toggling between 5V and ground. For example, applying 5V on the IN pin enables the switch while a ground potential on the IN pin disables the switch. The power is supplied to the switch through the battery voltage VBB pin, for example, a car battery in an automotive application. The switch 1 further comprises a ground potential GND pin.

When the load is not being driven, for example, an appliance is in OFF mode, no current flows out of the OUT pin or the IS pin. When a load $R_L$ is coupled to the OUT pin of the switch 1, a flow of load current $I_L$ is initiated. A corresponding sense current $I_s$ flows through the sense resistor $R_s$. The observed change in sense current $I_s$ is transmitted to a micro controller 5 which, for example, may further monitor the switch 1 to adjust the operation of the switch 1.

In inverse operating condition, although the supply voltage VBB is still maintained, the voltage of the OUT pin is temporarily increased. For example, the OUT pin may be biased to a potential larger than the battery voltage VBB. This state may result due to a change in the state of the load $R_L$. For example, due to external conditions, a load such as a motor may operate as a generator for some time, and therefore supply a voltage higher than the battery voltage. Alternately, in another example, the battery voltage drops while a secondary motor continues to rotate due to inertia. Similarly, if the load $R_L$ is a device that stores energy, under some conditions, the stored energy is fed back in case the supply voltage drops.

Under inverse operating conditions, using embodiments of the invention, a flow of reverse load current through the OUT pin and out of the IS pin of the switch 1 is blocked. In the absence of embodiments of the invention, a small portion of the inverse current flows out of the IS pin, but this is enough to disturb the current sense functionality. Most of the inverse current flows through the intrinsic body diode of the output DMOS. As the sense current under inverse conditions is much larger than the sense current $I_s$, significant damage is possible to both the switch 1 as well as to other monitoring devices coupled to the switch 1. Most likely, the output DMOS will be first damaged because most of this inverse current flows through it. Alternately, a controller monitoring the operation of the switch 1 may turn off the switch 1, incorrectly assuming the shorting of the switch 1. In various embodiments, the invention impedes a large flow of current through the IS pin and into the sense resistor $R_s$ during inverse operating conditions. In various embodiments, this is achieved by cutting off or diverting the inverse current by the introduction of suitable devices.

Figure 2:
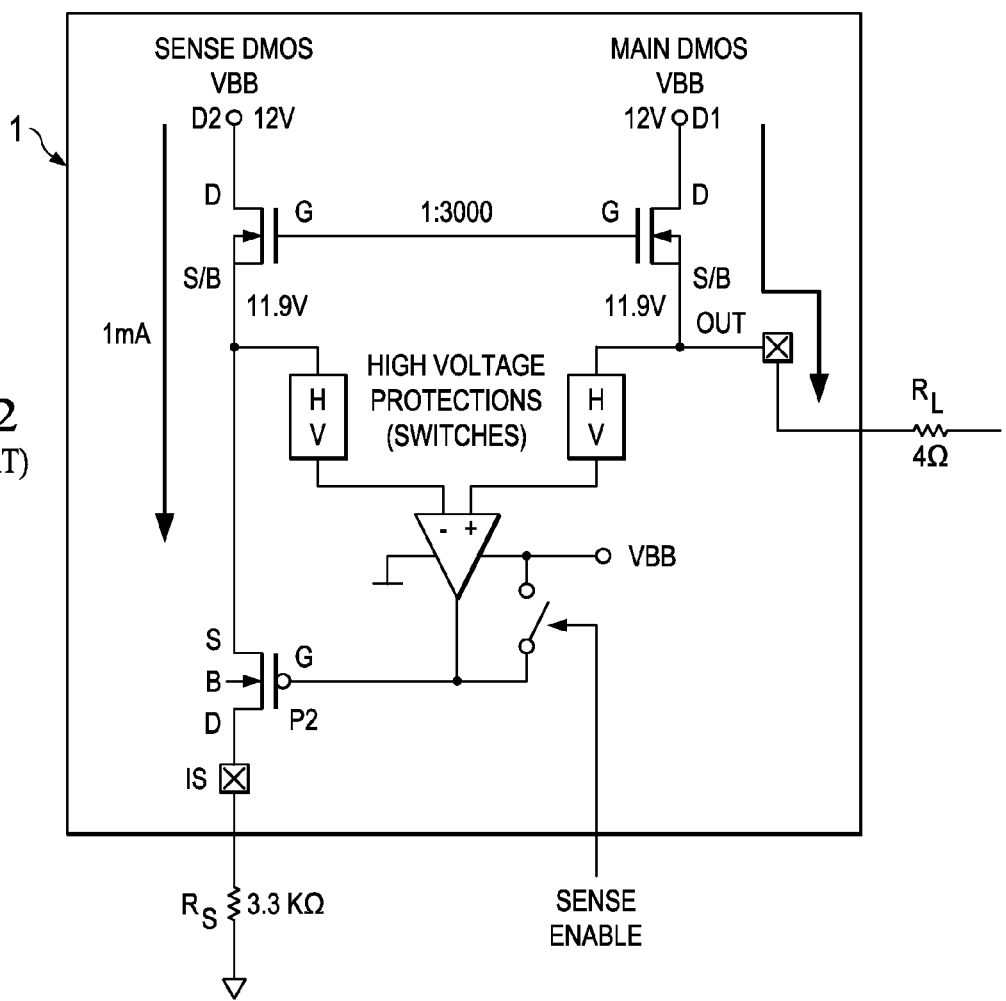
FIG. 2 illustrates a prior art switch under normal operation.

FIG. 2 illustrates a layout of a prior art switch. Referring to FIG. 2, the switch 1 comprises two transistors in parallel: a main DMOS D1 and a sense DMOS D2. The main DMOS transistor D1 is the power switching device that forms the switch 1 in that it conditionally couples the load $R_L$ to a battery voltage VBB based on its gate potential. Thus, the drain of the main DMOS D1 is coupled to the VBB pin coupled to the battery potential. A source of the main DMOS D1 is coupled to the OUT pin and hence the load $R_L$.

The sense DMOS transistor D2 forms the current sensor in that it supplies a current proportional to the load current $I_L$ if the potential applied to it are the same as those applied to the main DMOS transistor D1.

The width of the sense DMOS transistor $W_{D2}$ is smaller than the width of main DMOS transistor $W_{D1}$, and typically smaller by a factor of 1,000 to 100,000. The sense current $I_s$ flowing through the channel of the sense DMOS transistor D2 is consequently smaller by about the geometrical ratio of the channel width of the load DMOS and is therefore a measure of the load current $I_L$, i.e. $I_s \sim I_L \times W_{D2}/W_{D1}$. Hence, a measure of the sense current $I_s$ is a measure of the load current $I_L$.

FIG. 2 illustrates an example of the switch 1 during normal current sensing. The sense current $I_s$ flows through the sense DMOS transistor D2 through a second high voltage PMOS transistor P2 into the IS pin of the switch 1. The gate of the second high voltage PMOS transistor P2 is coupled to the output of an operational amplifier. The operational amplifier is activated by the sense enable switch, and powered by first and second supply pins coupled to the battery voltage VBB and a potential node, for example, in one embodiment, about 7V lower than battery voltage. The operational amplifier ensures that the second high voltage PMOS transistor P2 does not limit the amount of current flowing through the sense resistor $R_s$.

Hence, the amount of current flowing through the sense resistor $R_s$ is determined primarily by the sense DMOS transistor $D_2$. The width of the sense DMOS transistor $D_2$ is smaller than the width of main DMOS transistor D1 by about 3000 in one embodiment. Hence, the sense current $I_s$ is 3000 times smaller than the load current $I_L$. For example, if the sense current $I_s$ is 1 mA, the load current $I_L$ flowing through the main DMOS transistor D1 is 3 A.

Figure 3A:
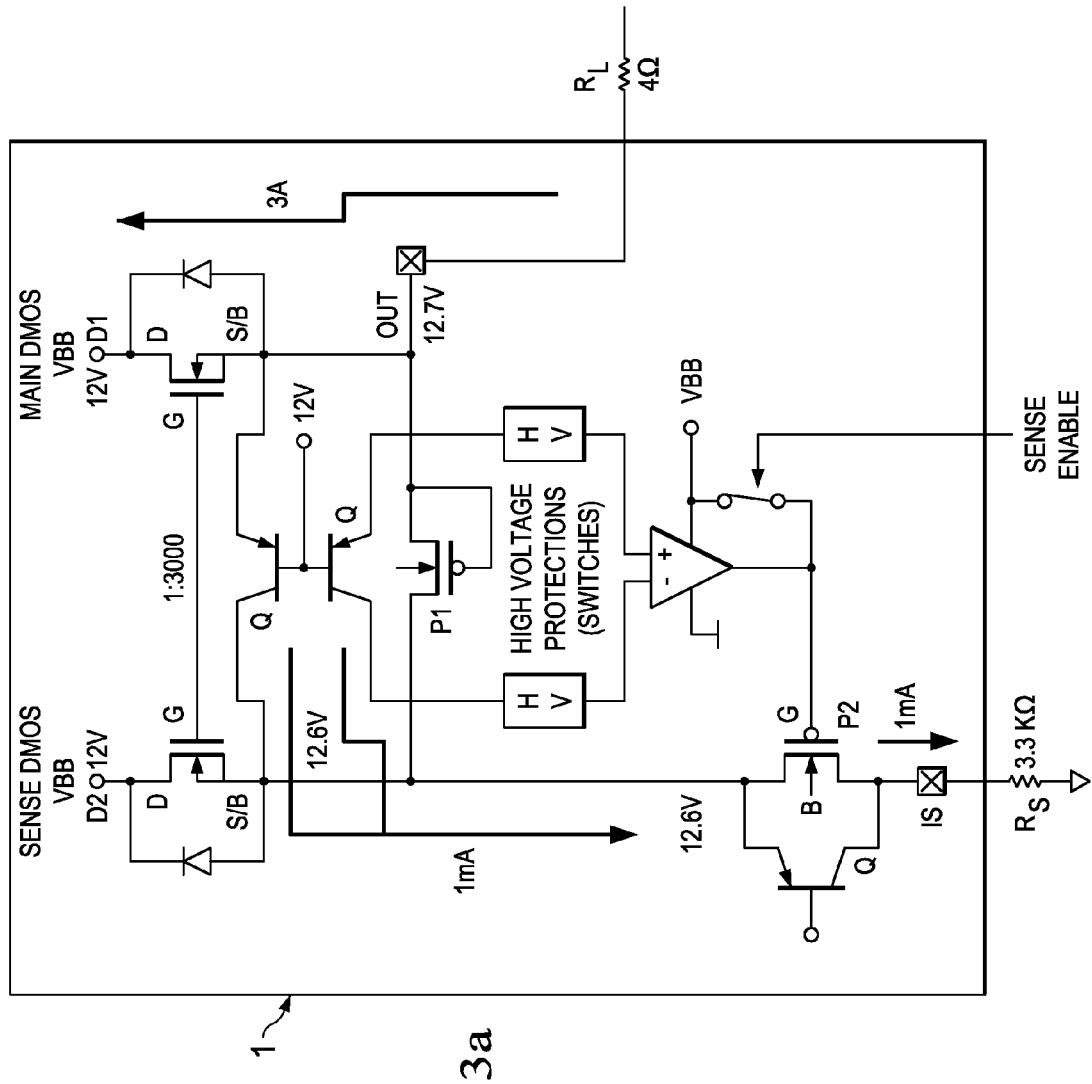
Figure 3B:
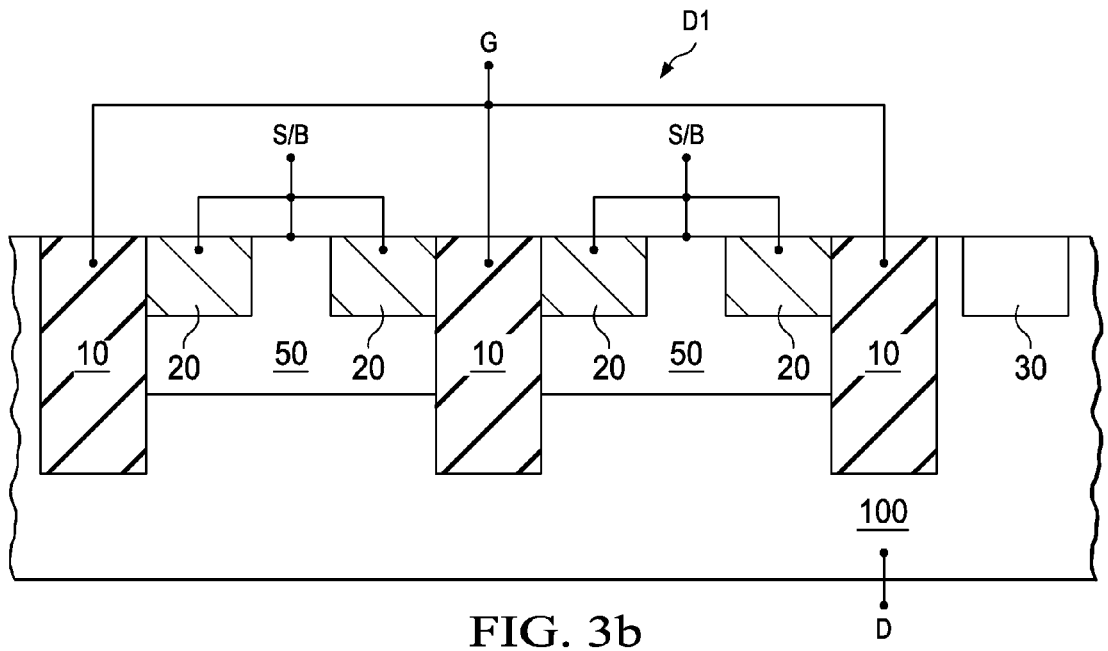
Figure 3C:
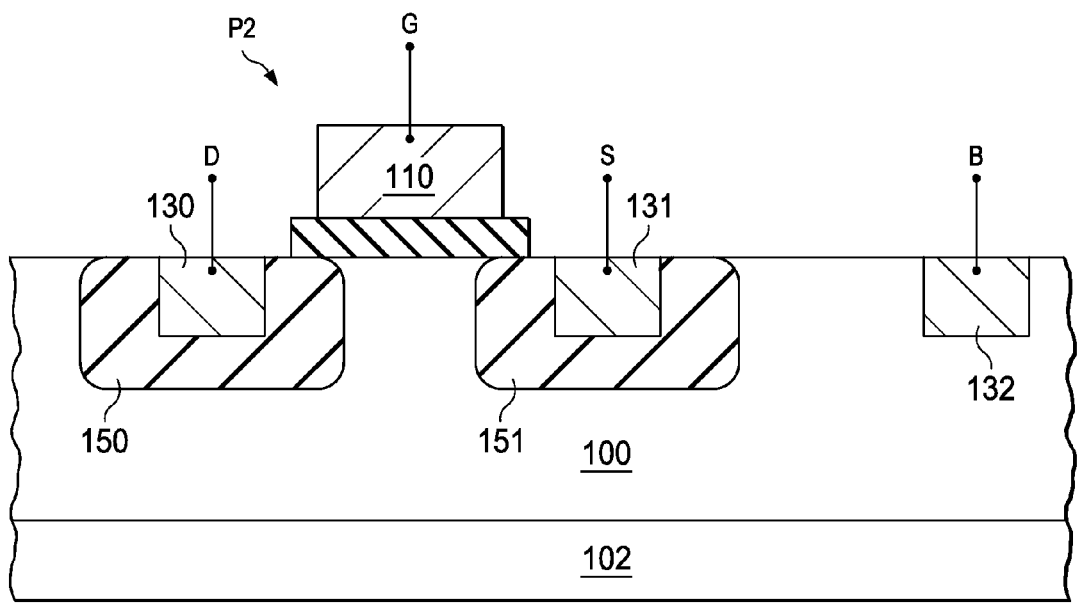

FIG. 3, which includes FIGS. 3a-3c, illustrates a layout of a switch and individual devices, in accordance with embodiments of the invention.

FIG. 3a illustrates the operation of a switch 1 (for example, as illustrated in FIG. 2) under inverse operating conditions.

As illustrated in FIG. 3a, the source of the main transistor D1 and the source of the sense transistor D2 are coupled together through a shorted high voltage PMOS diode P1 (MOS transistor in diode configuration). The high voltage PMOS diode P1 is capable of being biased at high voltages across the gate to drain nodes without a significant breakdown of the device components, for example, of the gate dielectric. The gate of the high voltage PMOS diode P1 is shorted to the source of the high voltage PMOS diode P1, while the substrate (or body) of the high voltage PMOS diode P1 is coupled to the battery voltage VBB. The substrate node of the high voltage PMOS diode P1 is the substrate of the whole chip, and is a not isolated PMOS device.

The potential at the OUT pin increases under inverse operation. We have discovered that this results in a large current flow through parasitic bipolar transistors Q. Further, we find that this current flows through a parasitic bipolar transistor Q of the second high voltage PMOS transistor P2 and into the sense resistor $R_s$.

FIGS. 3b and 3c illustrate the parasitic devices that are activated under inverse operating conditions. FIG. 3b illustrates the parasitic pnp transistor of the main DMOS transistor D1, whereas FIG. 3c illustrates the parasitic pnp transistor of the first or second high voltage transistors P1 or P2.

As illustrated in FIG. 3b, the main DMOS transistor D1 is disposed in a substrate 100. In the preferred embodiment, the substrate 100 is a silicon wafer. In various embodiments, the substrate 100 is doped with an n-type conductivity. Some examples of the substrate 100 are a bulk mono-crystalline silicon substrate (or a layer grown thereon or otherwise formed therein), and a layer of a silicon-on-insulator (SOI) wafer. In other embodiments, other semiconductors can be used with the wafer.

The drain contact D of the transistor is coupled to the substrate 100 whereas the source contact S of the transistor is coupled to a first doped region 20. The first doped region 20 comprises an n+ doping and is disposed in a second doped region 50. The second doped region 50 comprises a p-type doping. The second doped region 50 is coupled to a body contact B. The body contact B and the source contact S are coupled together.

Gate trench regions 10 are disposed within the substrate 100 and form the gate electrode G of the transistor. The gate trench regions 10 of the transistor comprise trenches, for example, shallow trench, filled with a conductive material. An insulating material lines the sidewall and bottom surface of the trench thus forming a layer between the conductive material and the substrate 100. The insulating material forms the gate dielectric of the transistor. The gate dielectric comprises an oxide, nitride, a high-k dielectric, or a combination thereof. The conductive material comprises doped polysilicon or a metal such as TiN, TaN, Al, W, Cu, or any other suitable metal.

The channel region is formed vertically along the sidewalls of the gate trench regions 10. Hence, the DMOS transistor comprises a source region comprising the first doped region 20, a channel formed in the second doped region 50, and a drain comprising the substrate 100. Further, the DMOS transistor comprises a parasitic diode between the second doped region 50 and the substrate 100, for example, between the two first doped regions 20. When a third doped region 30 comprising a p type region is disposed adjacent the DMOS transistor, a further parasitic bipolar transistor is formed. The second doped region 50 comprises the emitter of the parasitic bipolar transistor, the substrate 100 forms the base, while the third doped region 30 forms the collector of the parasitic bipolar transistor.

The drain contact D is biased to a potential smaller than the body contact B to the second doped region 50. Hence, the parasitic diode between the second doped region 50 and the substrate 100 is forward biased. Hence, the diode conducts a current, when the voltage difference between the drain contact D and the body contact B exceeds the built in voltage of this parasitic diode. This is in contrast to normal operating conditions, when this diode is reverse biased and does not conduct (or conducts a small leakage current). Similarly, under normal operating conditions, the parasitic bipolar transistor does not conduct except for a small leakage current.

Under inverse conditions, the emitter/base junction is forward biased resulting in activation of the parasitic bipolar transistor.

Hence, under inverse conditions, a large current flows through the main and sense DMOS transistors D1 and D2 into the second high voltage PMOS transistor P2. As an illustration, the parasitic transistor of the second high voltage PMOS transistor P2 is shown in FIG. 3c.

Referring to FIG. 3c, the second high voltage PMOS transistor P2 comprises a first $p^+$-doped region 130 disposed within a first p-doped region 150. The first $p^+$-doped region is coupled to a drain contact of the transistor. The first p-doped region 150 being separated from a second p-doped region 151 by the substrate 100. The first p-doped region 150 forms the drain, while the second p-doped region 151 forms the source of the transistor.

A second $p^+$-doped region 131 disposed within the second p-doped region 151 is coupled to the source contact S of the high voltage PMOS transistor. The substrate 100 comprises an n-type conductivity, thus forming the channel region. In various embodiments, the substrate 100 comprises an epitaxial n-type layer disposed on an $n^+$-substrate 102. A gate region 110 is disposed over the channel region, the gate region 110 being separated by a gate dielectric layer. The gate of the PMOS transistor is coupled to the battery voltage VBB. The substrate or body contact is made by coupling to an $n^+$ region 132 disposed on the substrate 100.

A parasitic bipolar transistor is formed within the MOS transistor, the parasitic bipolar transistor being formed from the layers of first p-doped region 150/substrate 100/second p-doped region 151. The drain of the transistor forms the emitter, the substrate 100 forms the base, and the collector comprises the source of the transistor.

The drain of the transistor is coupled to the battery voltage VBB which is higher than the potential at the substrate of the transistor. Hence, the parasitic pnp transistor is activated. Hence, even if the gate of the PMOS transistor is not biased, a current flows due to the conduction through the parasitic bipolar transistor.

The current flowing through the parasitic diode and/or parasitic transistors of the DMOS transistors flows through the parasitic transistor of the high voltage PMOS transistor and into the sense resistor $R_s$. While the leakage current under normal operating conditions is of the order of a few micro Amps, under inverse operating conditions, this current may be a couple of milli Amps. Hence, the microcontroller monitoring the sense current $I_s$ will make erroneous measurements and/or corrections. Embodiments of the invention overcome these limitations as under inverse operating conditions.

Figure 4A:
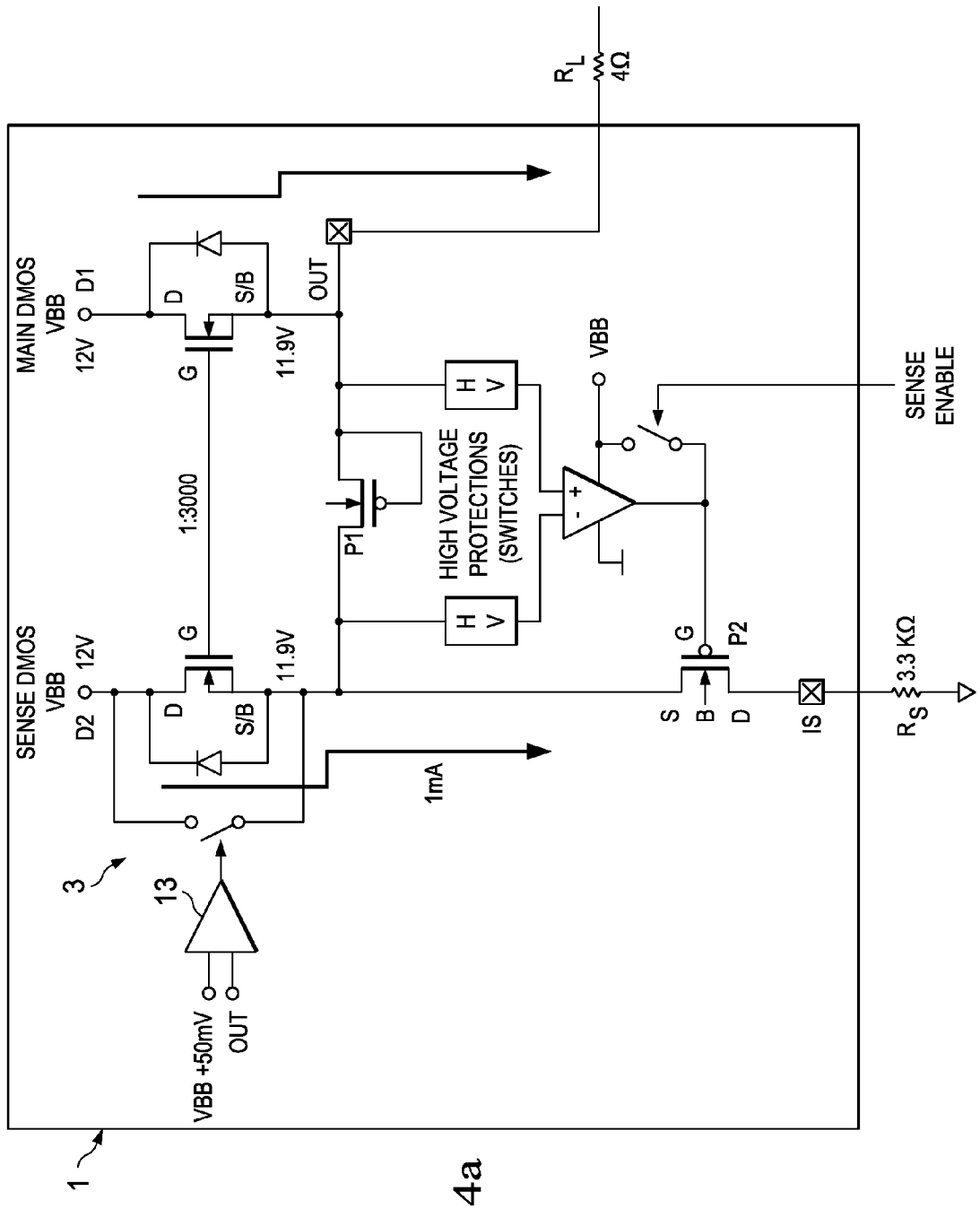
Figure 4B:
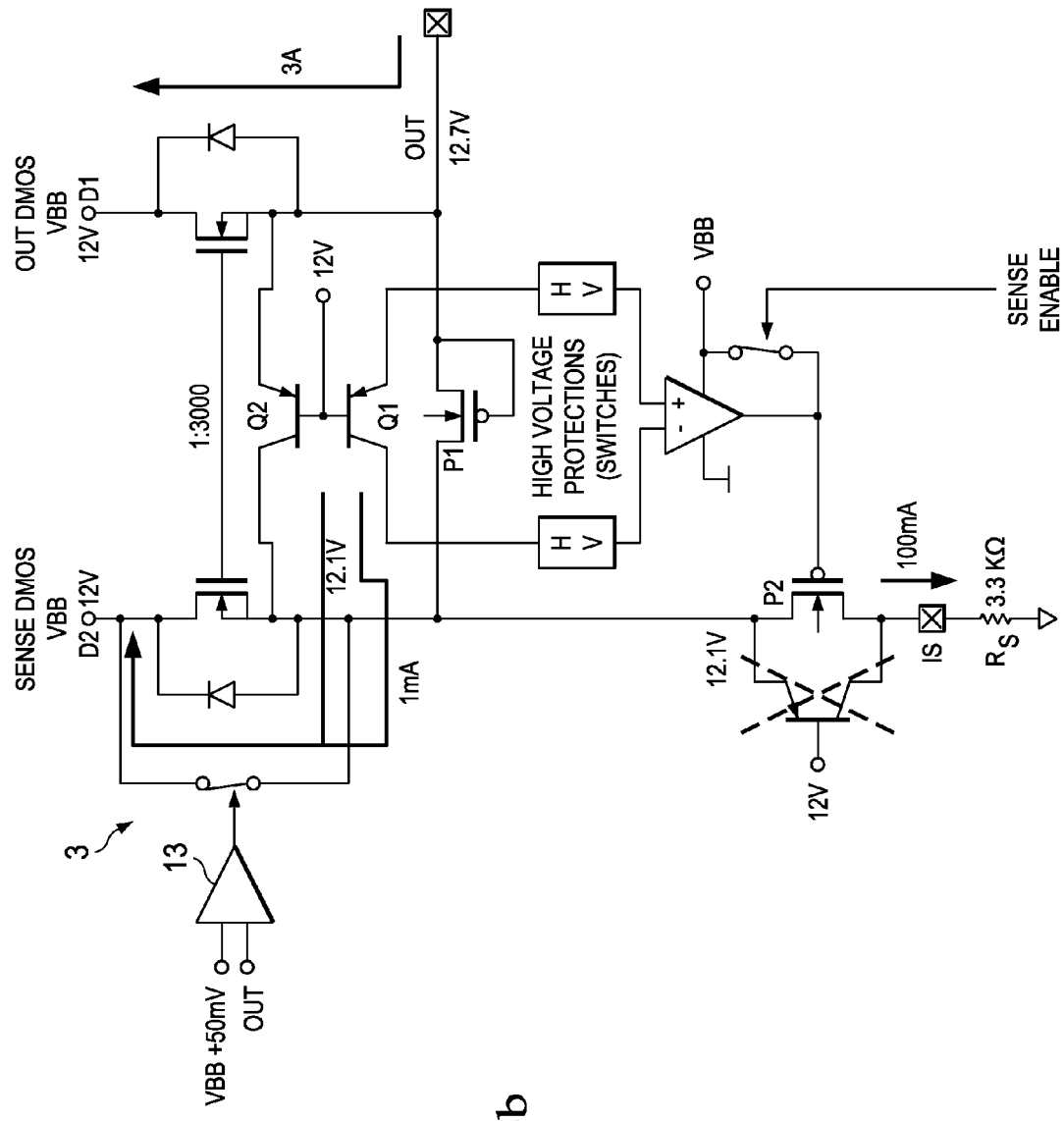
Figure 5:
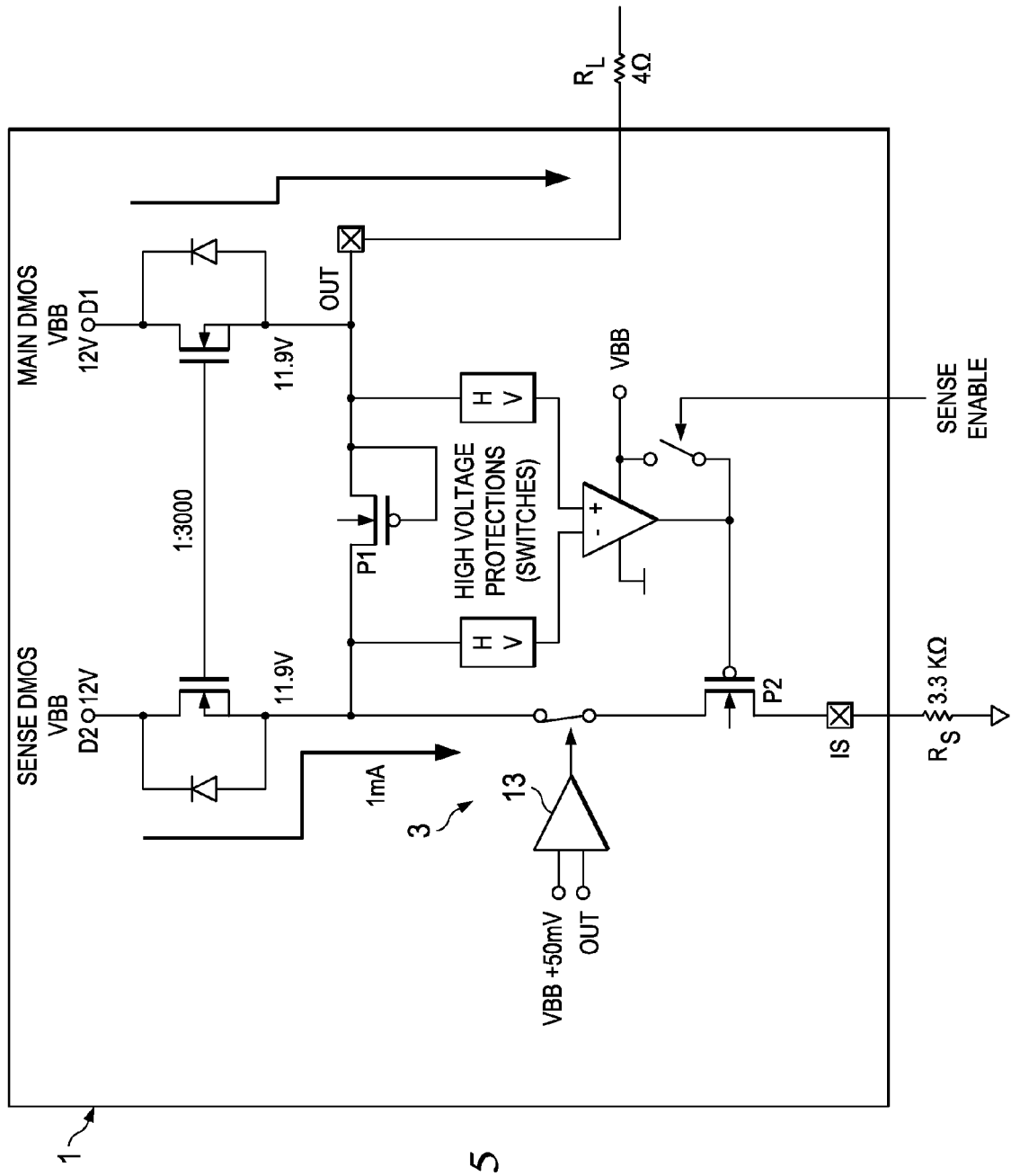
FIG. 5 is an illustration of operation of a switch with an additional switch to minimize parasitic conduction during inverse operation, in accordance with an embodiment of the invention.

FIG. 4, which includes FIGS. 4a and 4b, illustrates an embodiment of the invention using an auxiliary switch and comparator.

Referring to FIG. 4a, the switch 1 comprises two transistors in parallel: a main DMOS D1 and a sense DMOS D2, an auxiliary switch 3, and a comparator 13. The main DMOS D1 and sense DMOS D2 are described above. The auxiliary switch 3 is coupled to a comparator 13 and is disposed between a PMOS diode P1 coupled to the OUT pin and the battery voltage VBB. Under normal operating conditions, the auxiliary switch 3 is open with no current flowing through it. The auxiliary switch 3 is enabled by the comparator 13. The comparator 13 senses and compares the voltage at the OUT pin and the battery voltage. The auxiliary switch 3 is open under normal operation as the voltage at the OUT pin is less than the battery voltage. However, the comparator 13 closes the auxiliary switch 3 under inverse operation allowing a flow of current through the auxiliary switch 3.

However, if this voltage at the OUT pin is higher than the battery voltage VBB plus a predetermined delta (for example, 50 mV), the auxiliary switch 3 is closed (FIG. 4b). Thus, the auxiliary switch 3 creates an independent current path that is triggered by the potential difference between the OUT pin and the battery voltage VBB.

When the auxiliary switch 3 is closed, the current flowing through the parasitic body diode is blocked, and instead the current flows through the lower resistive path through the auxiliary switch 3. Hence, the parasitic bipolar transistors Q1 and Q2 of the main and sense DMOS transistors D1 and D2 are also blocked off.

Further, the voltage drop across the auxiliary switch 3 is low (for example, on the order of about 100 mV). Hence, the parasitic pnp of the high voltage transistor P2 is deactivated because the potential at the drain of the high voltage PMOS transistor P2 is smaller than the built in potential (typically greater than 0.5V and about 0.7V) required for current conduction through the parasitic pnp transistor of the high voltage PMOS transistor P2.

Although in this embodiment, the comparator 13 is used to enable and disable the auxiliary switch 3, in some embodiments, the comparator 13 may provide an output signal for example, an independent error signal. A micro-controller may use the reading of the error signal before or during sensing the sense resistor. For example, the micro controller may discard the current reading through the sense resistor $R_s$ if the error signal indicates that the OUT pin is at a higher voltage than the battery voltage VBB by a predefined voltage.

FIG. 5 illustrates a layout of a switch and a comparator in accordance with embodiments of the invention.

FIG. 5 is similar to FIG. 4 in providing an auxiliary switch 3 and a comparator 13. Unlike FIG. 4, the auxiliary switch 3 is enabled by the comparator 13 only when the OUT voltage is lower than the battery voltage VBB. Hence, the auxiliary switch 3 is closed and allows current to flow through it when the OUT voltage is lower than the battery voltage VBB (normal operation). However, if the OUT voltage is greater than the battery voltage VBB, the comparator opens the auxiliary switch 3, cutting current flow through the sense resistor $R_s$. For example, in FIG. 5, the auxiliary switch 3 is closed only if the OUT voltage is lower than the battery voltage VBB by 50 mV.

Figure 6A:
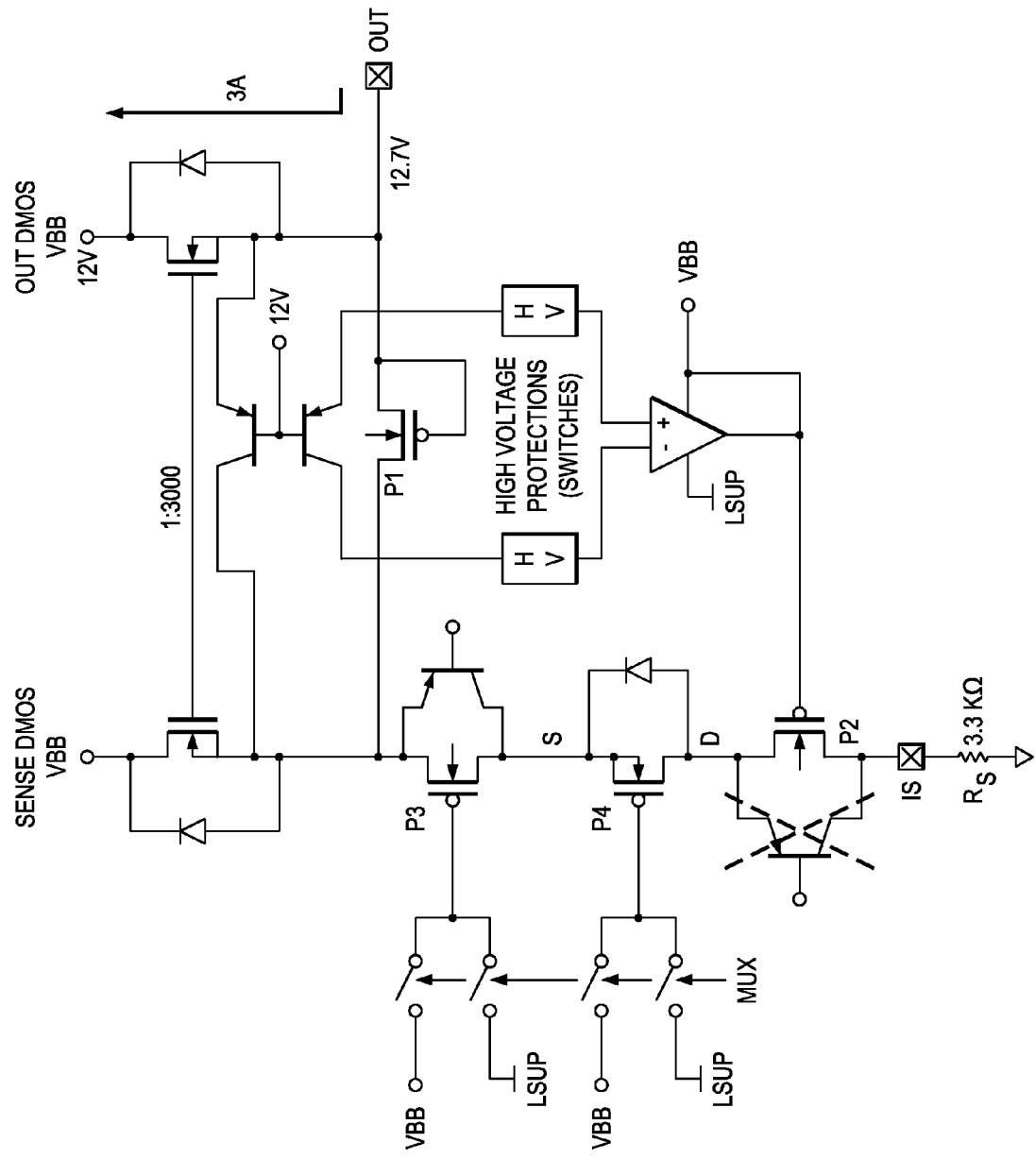
FIGS. 6a-6c, is an illustration of operation of a switch using blocking diodes to minimize parasitic conduction during inverse operation, in accordance with embodiments of the invention.
Figure 6B:
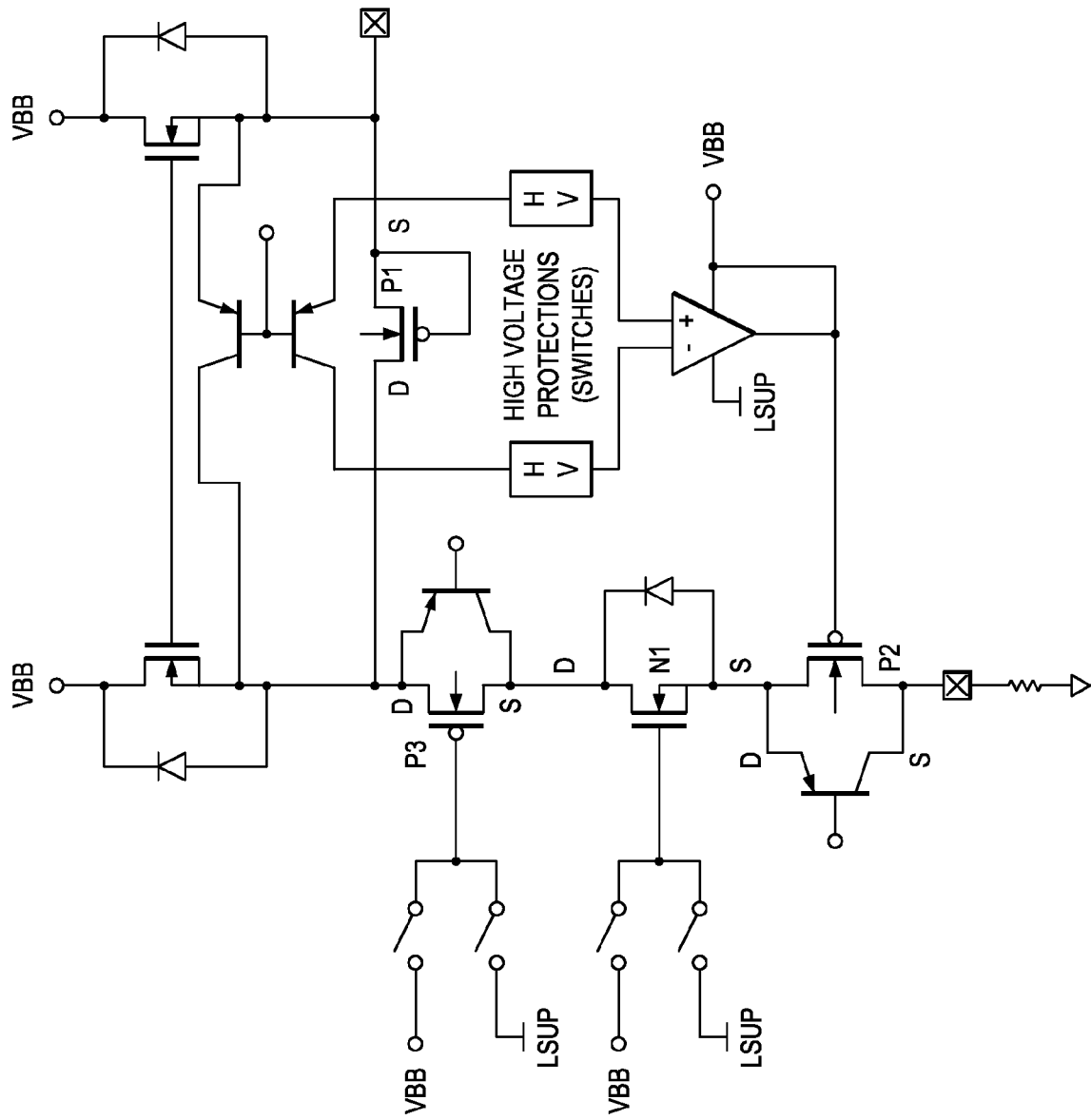
Figure 6C:
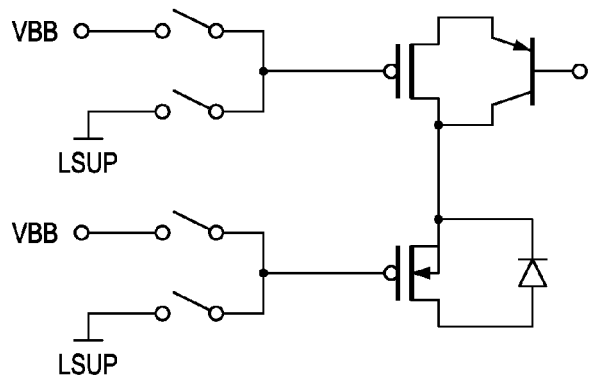

FIG. 6, which includes FIGS. 6a-6c, illustrates alternate embodiments of using a blocking diode to reduce the current flowing out of the IS pin during inverse operating mode. FIGS. 6a and 6b illustrate alternative embodiments of the invention using the embodiment of FIG. 5.

Referring to FIG. 6a, a third high voltage PMOS transistor P3 is coupled before the second high voltage transistor P2. A low voltage PMOS transistor P4 is coupled between the third high voltage PMOS transistor P3 and the fourth high voltage PMOS transistor P4. The source S of the low voltage PMOS transistor P4 is coupled to the drain of the third high voltage PMOS transistor P3, and the drain D of the low voltage PMOS P4 is coupled to the source of the second high voltage PMOS transistor P2. The source S and body of the low voltage PMOS transistor P4 are shorted together, thus forming a blocking diode. The body/drain junction of the low voltage transistor is reverse biased and blocks the flow of current into the second high voltage PMOS transistor P2. Hence, the parasitic pnp transistor of the second high voltage PMOS transistor P4 does not conduct, thus minimizing the flow of current out of the IS pin.

During normal operation, the multiplexer connects the gate terminals of the third high voltage PMOS transistor P3 and the low voltage PMOS transistor P4 to a supply potential (LSUP) if the microcontroller requires current sensing. However, during inverse current operation or in the case that the microcontroller disables the current sensing functionality, the gate nodes are pulled up to battery voltage VBB and the body diode of the low voltage PMOS transistor P4 blocks the parasitic current. Hence, the low voltage PMOS transistor P4 forms a switch (for example, auxiliary switch 3 in FIG. 5).

Although the third high voltage PMOS transistor P3 is coupled before the second high voltage transistor P2, in some embodiments, the third high voltage PMOS transistor P3 is coupled after the second high voltage transistor P2 but before the sense resistor $R_s$ (or IS pin of the chip).

FIG. 6b illustrates an alternative embodiment wherein a NMOS device is used to form a blocking diode forming a switch (for example, auxiliary switch 3 in FIG. 5). Referring to FIG. 6b, a third high voltage PMOS transistor P3 is coupled before the second high voltage transistor P2. A low voltage NMOS transistor N1 is coupled between the third high voltage PMOS transistor P3 and the fourth high voltage PMOS transistor P4. The drain D of the low voltage NMOS transistor N1 is coupled to the source of the third high voltage PMOS transistor P3, while the drain of third high voltage PMOS transistor P3 is connected to the drain of the PMOS diode P1. The source S of the low voltage PMOS is coupled to the drain of the second high voltage PMOS transistor P2. The source S and body of the low voltage NMOS transistor N1 are shorted together, thus forming a blocking diode. The source/body junction of the low voltage transistor is reverse biased, and blocks the flow of current into the second high voltage PMOS transistor P2. Hence, the parasitic pnp transistor of the second high voltage PMOS transistor does not conduct, thus minimizing the flow of current out of the IS pin. It is noted that for the low voltage NMOS transistor N1, the polarity applied at its gate during inverse current operation is inverted relative to a low voltage PMOS transistor (e.g., low voltage PMOS transistor P4 of FIG. 6a).

FIG. 6c illustrates an embodiment of the invention using a blocking diode to protect the inputs to the operational amplifier from high voltage during inverse operating mode. The high voltage HV protection circuitry, for example, represented as boxes HV, is illustrated in FIG. 5. The HV protection circuit comprises a high voltage PMOS transistor coupled in series with a low voltage PMOS transistor with a source/body contact being shorted together as described in earlier embodiments. Thus, the body/drain junction of the low voltage PMOS transistor is reverse biased providing protection to the operational amplifier.

In various embodiments, a single chip may include blocking diodes as illustrated in FIGS. 6a, 6b, and 6c. Further, various embodiments of the invention also include combinations of the embodiments of FIGS. 4, 5, and 6. For example, one embodiment of the invention includes the switch (e.g., auxiliary switch 3 enabled by the comparator 5 of FIG. 4) and the blocking diode (e.g., a three terminal MOS transistor as described in FIG. 3).

Figure 7:
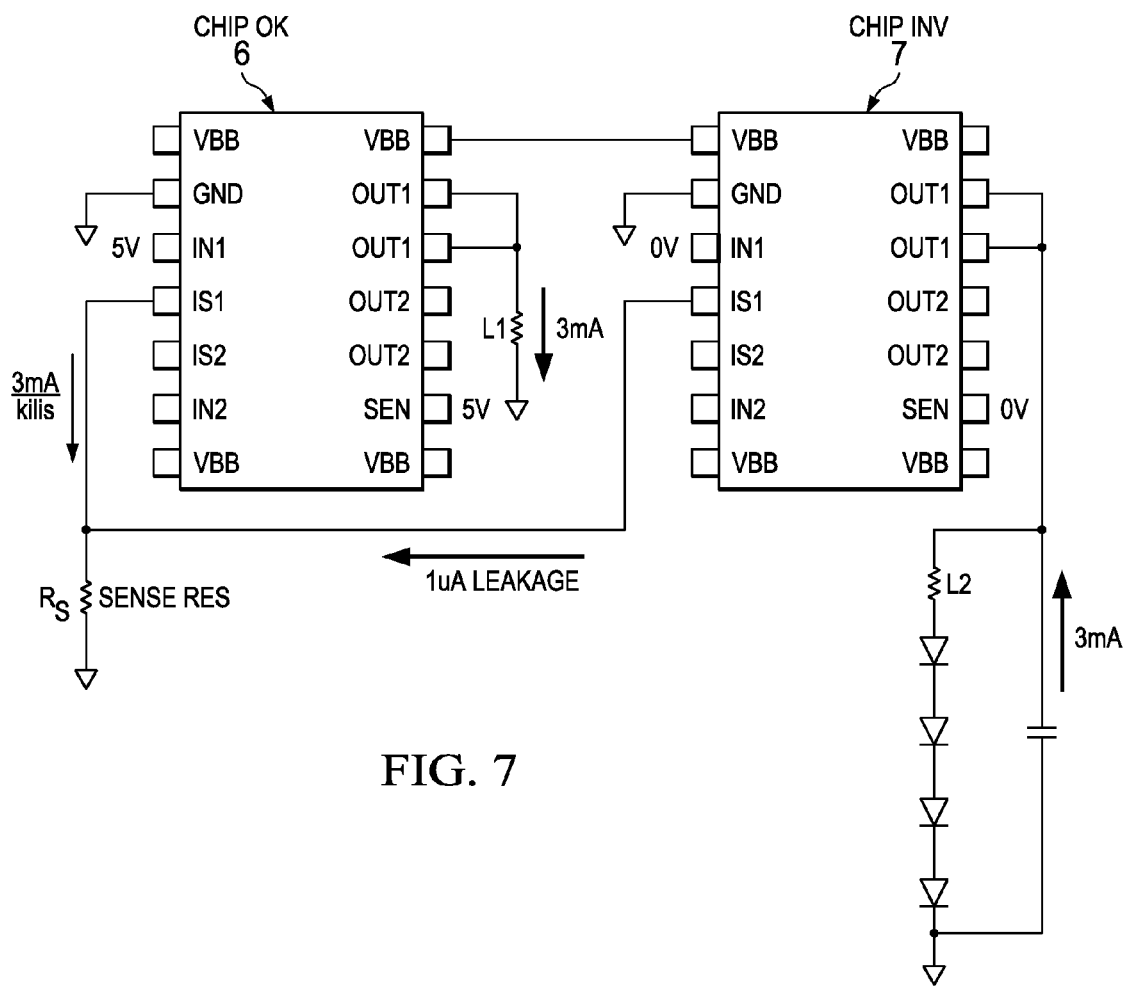
FIG. 7 illustrates an implementation of an embodiment of the invention for controlling multiple chips with a single microcontroller using a time multiplexing technique.

FIG. 7 illustrates an implementation on multiple chips in accordance with an embodiment of the invention. FIG. 7 illustrates two chips, a first chip 6, and a second chip 7. Both the chips are coupled to a single sense resistor Rs that is monitored by a microcontroller (not shown). Each of the chips comprises pins for VBB, GND, Inx, OUTx, ISx, and SEN, where the VBB pin is configured to be coupled to the battery voltage, for example 12V. The GND pin is the pin for coupling to the ground potential. The Inx pin decides the channel being activated, for example, the corresponding OUTx pin of the chip is activated by the potential applied on the INx pin. OUTx pin is the output of the main switch and is hence connected to the loads that are to be driven. For example, in one embodiment, a 5V on the IN1 enables the OUT1 and hence drives the load coupled to OUT1, while a 0V on the IN1 pin disables the OUT1 pin and hence cuts off power supply to the load. ISx is the diagnosis pin and the pin used for sensing the load current using the sense resistor Rs. The SEN pin enables the diagnosis operation, for example, it toggles between 5V and 0V. Thus, the diagnosis functionality is enabled/disabled according the to SEN pin.

If both chips are under normal operating conditions, for example, if the diagnosis of the first chip 6 is enabled and the diagnosis of the second chip 7 is disabled, the sense current measured by the microcontroller corresponds to the current through the first load L1. Similarly, if the first chip 6 is disabled and the second chip 7 is enabled, the sense current measured by the microcontroller corresponds to the current through the second load L2.

If however, the first chip 6 is operating under normal operating conditions, the second chip 7 is under inverse operating mode. In the absence of the embodiments of the invention, even if both the first and the second chips 6 and 7 are disabled, a large current flows out of the IS1 pin of the second chip 7 (as described in FIG. 3*a*), resulting in an erroneous measurement of the state of the first chip 6.

However, if the second chip 7 includes embodiments of the inventions as described in FIGS. 3 and/or 4, a leakage current of the order of about a few microAmps flows from the IS1 pin of the second chip 7. Hence, the current flowing through the sense resistor $R_s$ is about the same as the current flowing out of the IS1 pin of the first chip 6 if only the first chip 6 is enabled. Hence, the microcontroller reads the current flowing through the first chip 6 to calculate the first load L1 accurately.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A current control circuit comprising:
   a first MOS transistor having a first source/drain coupled to an output of a power source, and a second source/drain of the first MOS transistor coupled to a first output node of the current control circuit;
   a second MOS transistor having a first source/drain coupled to the output of the power source, a second source/drain of the second MOS transistor coupled to a second output node of the current control circuit; and
   means for blocking flow of current from the first output node of the current control circuit to the second output node of the current control circuit when a potential at the first output node is higher than a potential at the output of the power source, wherein the means for blocking flow of current from the first output node of the current control circuit to the second output node of the current control circuit comprises a switch coupled between the output of the power source and the first output node of the current control circuit.

2. The circuit of claim 1, wherein the switch is configured to conduct when the potential at the first output node is higher than the potential at the output of the power source.

3. The circuit of claim 2, further comprising a comparator, a first input of the comparator coupled to the output of the power source, a second input of the comparator coupled to the first output node of the current control circuit, wherein the comparator causes the switch to conduct when the potential at the first output node is higher than the potential of the output of the power source.

4. The circuit of claim 3, wherein the comparator comprises a voltage comparator, wherein the voltage comparator enables the switch to conduct if the potential at the first output node is higher than the potential of the output of the power source by a predetermined voltage.

5. The circuit of claim 4, wherein the predetermined voltage is about 50 mV.

6. The circuit of claim 2, wherein the means for blocking flow of current from the first output node of the current control circuit to the second output node of the current control circuit further comprises a blocking diode, wherein the second source/drain of the second MOS transistor is coupled to the second output node of the current control circuit through the blocking diode, and wherein the blocking diode is configured to block a flow of current when the potential at the first output node is higher than the potential at the output of the power source.

7. The circuit of claim 1, wherein the first output node is configured to couple to a load, and wherein the second output node is configured to couple to a sense resistor.

8. The circuit of claim 1, wherein gates of the first and the second MOS transistors are coupled together.

9. The circuit of claim 1, wherein the first MOS transistor comprises a power DMOS transistor, and wherein the second MOS transistor comprises a sense DMOS transistor.

10. The circuit of claim 9, wherein the sense DMOS transistor comprises an effective width that is smaller than the power DMOS transistor.

11. The circuit of claim 9, wherein an effective width of the sense DMOS transistor is at least 2000 times smaller than an effective width of the power DMOS transistor.

12. The circuit of claim 1, wherein the second source/drain of the first MOS transistor is coupled to the second source/drain of the second MOS transistor through a third MOS transistor.

13. The circuit of claim 12, wherein the third MOS transistor comprises a high voltage PMOS transistor, wherein a gate of the third MOS transistor is coupled to the second source/drain of the first MOS transistor.

14. The circuit of claim 12, further comprising:
   an operational amplifier with a first input coupled to the first output node of the control circuit, a second input of the operational amplifier coupled to the second source/drain of the second MOS transistor; and
   a fourth MOS transistor having a first source/drain coupled to the second source/drain of the second MOS transistor, wherein an output of the operational amplifier is coupled to a gate of the fourth MOS transistor.

15. The circuit of claim 14, wherein the first input of the operational amplifier is coupled to the first output node of the control circuit through a second blocking diode, and the second input of the operational amplifier is coupled to the second source/drain of the second MOS transistor through a third blocking diode.

16. The circuit of claim 1, wherein the means for blocking flow of current from the first output node of the current control circuit to the second output node of the current control circuit comprises a blocking diode, wherein the second source/drain of the second MOS transistor is coupled to an input of the blocking diode, wherein an output of the blocking diode is coupled to the second output node of the control circuit, wherein the blocking diode is reverse biased when the potential at the first output node is higher than the potential at the output of the power source.

17. The circuit of claim 16, wherein the blocking diode does not block a flow of current if a potential at the first output node is not higher than a potential at the output of the power source.

18. The circuit of claim 16, wherein the blocking diode comprises a PMOS transistor, wherein a first source/drain of the PMOS transistor is coupled to the second source/drain of the second MOS transistor, wherein a bulk contact of the PMOS transistor is shorted to the first source/drain of the PMOS transistor, and wherein a second source/drain of the PMOS transistor is coupled to the second output of the control circuit.

19. The circuit of claim 18, wherein the first source/drain of the PMOS transistor is coupled to the second source/drain of the second MOS transistor through a third MOS transistor.

20. The circuit of claim 16, wherein the blocking diode comprises a NMOS transistor, wherein a first source/drain of the NMOS transistor is coupled to the second source/drain of the second MOS transistor, wherein a second source/drain of the NMOS transistor is coupled to the second output of the control circuit, and wherein a bulk contact of the NMOS transistor is shorted to the second source/drain of the NMOS transistor.

21. The circuit of claim 20, wherein the first source/drain of the NMOS transistor is coupled to the second source/drain of the second MOS transistor through a third MOS transistor.

22. A method of operating a control circuit from inverse current, the method comprising:
providing a control circuit comprising a power transistor and a sense transistor, wherein a first source/drain of the power transistor is coupled to an output node of a power source, wherein a second source/drain of the power transistor is coupled to an first output node of the control circuit, the first output node being configured to be coupled to a load, wherein a first source/drain of the sense transistor is coupled to the output of the power source, wherein a second source/drain of the sense transistor is coupled to a second output of the control circuit, and wherein the second output of the control circuit is configured to be coupled to a sense resistor;
blocking current flow from the first output node of the control circuit to the second output of the control circuit when a potential at the first output of the control circuit is larger than a potential at the output of the power source; and
an operational amplifier with a first input coupled to the first source/drain of the power transistor, a second input of the operational amplifier coupled to the second source/drain of the sense transistor.

23. The method of claim 22, wherein blocking current flow from the first output node of the control circuit to the second output of the control circuit comprises:
comparing the potential at the first output of the control circuit with the potential at the output node of the power source;
generating a sense signal if the potential at the first output of the control circuit is larger than the potential at the output of the power source; and
coupling the first output of the control circuit and the output of the power source using a switch, the switch being activated by the sense signal.

24. The method of claim 23, wherein the control circuit further comprises:
a comparator to compare the potential at the first output of the control circuit with the potential at the output node of the power source, wherein the comparator generates the sense signal;
a MOS transistor; and
a first source/drain of the MOS transistor coupled to the second source/drain of the sense transistor, wherein an output of the operational amplifier is coupled to a gate of the MOS transistor.

25. The method of claim 23, wherein blocking current flow from the first output node of the control circuit to the second output of the control circuit comprises:
activating a blocking diode if a potential at the power source is not greater than the potential at the first output node, the blocking diode being configured to block a flow of current if activated; and
deactivating the blocking diode if a potential at the power source is greater than the potential at the first output node, wherein a second source/drain of the sense transistor is coupled to an input of the blocking diode, wherein an output of the blocking diode is coupled to a second output of the control circuit through a MOS transistor, and wherein the second output of the control circuit is configured to be coupled to a sense resistor.

26. The method of claim 25, wherein the blocking diode comprises a PMOS transistor, wherein a first source/drain of the PMOS transistor is coupled to the second source/drain of the sense transistor, wherein a bulk contact of the PMOS transistor is shorted to the first source/drain of the PMOS transistor, wherein a second source/drain of the PMOS transistor is coupled to the second output of the control circuit, and wherein the control circuit further comprises:
a third MOS transistor, wherein the first source/drain of the PMOS transistor is coupled to the second source/drain of the sense transistor through a third MOS transistor;
a fourth MOS transistor, wherein the second source/drain of the power transistor is coupled to the second source/drain of the sense transistor through the fourth MOS transistor;
an operational amplifier with a first input coupled to the first output node of the control circuit, a second input of the operational amplifier coupled to the second source/drain of the sense transistor; and
a fifth MOS transistor having a first source/drain, the first source/drain of the fifth MOS coupled to the second source/drain of the sense transistor through the blocking diode, wherein an output of the operational amplifier is coupled to a gate of the fifth MOS transistor.

27. A current control circuit comprising:
a first MOS transistor having a first source/drain coupled to an output of a power source, and a second source/drain coupled to a first output node of the current control circuit;

a second MOS transistor having a first source/drain coupled to the output of the power source, and a second source/drain coupled to a second output node of the current control circuit, wherein gates of the first and the second MOS transistors are coupled together;

a comparator, a first input of the comparator coupled to the output of the power source, a second input of the comparator coupled to the first output node of the current control circuit; and a switch coupled to an output of the comparator, the switch configured to be activated by the output of the comparator, wherein the switch is coupled between the output of the power source and the first output node of the current control circuit.

28. A current control circuit comprising:

a first MOS transistor having a first source/drain coupled to an output of a power source, and a second source/drain of the first MOS transistor coupled to a first output node of the current control circuit;

a second MOS transistor having a first source/drain coupled to the output of the power source, a second source/drain of the second MOS transistor coupled to a second output node of the current control circuit; and means for blocking flow of current from the first output node of the current control circuit to the second output node of the current control circuit when a potential at the first output node is higher than a potential at the output of the power source, wherein the first MOS transistor comprises a power DMOS transistor, wherein the second MOS transistor comprises a sense DMOS transistor, and wherein an effective width of the sense DMOS transistor is at least 2000 times smaller than an effective width of the power DMOS transistor.

29. A current control circuit comprising:

a first MOS transistor having a first source/drain coupled to an output of a power source, and a second source/drain of the first MOS transistor coupled to a first output node of the current control circuit;

a second MOS transistor having a first source/drain coupled to the output of the power source, a second source/drain of the second MOS transistor coupled to a second output node of the current control circuit; and means for blocking flow of current from the first output node of the current control circuit to the second output node of the current control circuit when a potential at the first output node is higher than a potential at the output of the power source; and an operational amplifier with a first input coupled to the first output node of the control circuit, a second input of the operational amplifier coupled to the second source/drain of the second MOS transistor.

30. The circuit of claim 29, wherein the second source/drain of the first MOS transistor is coupled to the second source/drain of the second MOS transistor through a third MOS transistor.

31. The circuit of claim 29, further comprising:

a third MOS transistor having a first source/drain coupled to the second source/drain of the second MOS transistor, wherein an output of the operational amplifier is coupled to a gate of the third MOS transistor.

* * * * *